(12) United States Patent
Koji

(10) Patent No.: US 7,570,134 B2
(45) Date of Patent: Aug. 4, 2009

(54) MICRO-RESONATOR AND COMMUNICATION APPARATUS

(75) Inventor: Naniwada Koji, Kanagawa (JP)

(73) Assignee: Sony Corporation, Tokyo (JP)

( * ) Notice: Subject to any disclaimer, the term of this patent is extended or adjusted under 35 U.S.C. 154(b) by 313 days.

(21) Appl. No.: 10/595,666

(22) PCT Filed: Nov. 5, 2004

(86) PCT No.: PCT/JP2004/016800

§ 371 (c)(1),
(2), (4) Date: May 3, 2006

(87) PCT Pub. No.: WO2005/046051

PCT Pub. Date: May 19, 2005

(65) Prior Publication Data

US 2007/0024159 A1    Feb. 1, 2007

(30) Foreign Application Priority Data

Nov. 6, 2003  (JP)  ............................. 2003-377302

(51) Int. Cl.
*H03H 9/00*  (2006.01)
*H03H 9/24*  (2006.01)
(52) U.S. Cl. ...................................... 333/186; 333/189
(58) Field of Classification Search ................. 333/185, 333/186, 197, 200
See application file for complete search history.

(56) References Cited

U.S. PATENT DOCUMENTS

| 5,589,082 | A | 12/1996 | Lin |
| 6,489,864 | B2 * | 12/2002 | Frey et al. .................... 333/197 |
| 6,549,097 | B2 * | 4/2003 | Guillon et al. ............... 333/174 |
| 7,286,027 | B2 * | 10/2007 | Tada et al. .................... 333/186 |
| 7,352,254 | B2 * | 4/2008 | Tanaka ................... 331/116 M |
| 7,463,105 | B2 * | 12/2008 | Morita et al. ................ 331/154 |
| 7,463,116 | B2 * | 12/2008 | Naniwada .................... 333/186 |
| 7,489,212 | B2 * | 2/2009 | Morita et al. ................ 333/186 |
| 7,498,901 | B2 * | 3/2009 | Naniwada et al. ........... 333/133 |

FOREIGN PATENT DOCUMENTS

EP    2003295068    10/2003

(Continued)

OTHER PUBLICATIONS

Japanese Office Action issued on Nov. 27, 2007 in connection with Japanese Patent Application No. JP2003-377302.

(Continued)

*Primary Examiner*—Dean O Takaoka
(74) *Attorney, Agent, or Firm*—Sonnenschein Nath & Rosenthal LLP

(57) ABSTRACT

The present invention provides a micro-resonator in which it is possible to lower synthesized impedance and it is possible to apply it to devices to be desired. Also, the present invention provides a communication apparatus provided with a filter composed of such a micro-resonator.

A micro-resonator according to the present invention is constituted by connecting a plurality of micro-resonator devices including a beam structure in parallel electrically. A communication apparatus of the present invention uses a filter composed of the above-described micro-resonator as its filter.

7 Claims, 7 Drawing Sheets

FOREIGN PATENT DOCUMENTS

JP          09-238025          9/1997

OTHER PUBLICATIONS

Communication for European Application No. 04818258.8-2215 dated Apr. 22, 2008.

John R. Clark, et al., "Parallel-Resonator HF Micromechanical Bandpass Filters," 1997 International Conference on Solid-State Sensors and Actuators, Chicago, Jun. 16-19, 1997.

Mustafa U. Demirci, et al., "Mechanically Corner-Coupled Square Microresonator Array for Reduced Series Motional Resistance," 12th International Conference on Tranducers, Solid State Sensors, Actuators and Microsystems, Boston, Jun. 8-12, 2003.

Clark T.C. Nguyen, "RF Mems for Wireless Applications," Center for Wireless Integrated Microsystems (WIMS), University of Michigan., 2002.

Yan T, et al., "Thick-film PZT-Metallic Triple Beam Resonator," Electronics Letters, vol. 39, No. 13, Jun. 2003.

Seungbae Lee et al.; Influence of Automatic Level Control on Micromechanical Resonator Oscillator Phase Noise; 2003 IEEE International Frequency Control Symposium and PDA Exhibition.

Mustafa U. Demirci et al.; Higher-Mode Free-Free Beam Micromechanical Resonators; 2003 IEEE International Frequency Control Symposium and PDA Exhibition.

Clark T.C. Nguyen et al.; Design and Performance of CMOS Micromechanical Resonator Oscillators; 1994 IEEE International Frequency Control Symposium.

International Search Report dated Mar. 1, 2005.

* cited by examiner

*FIG. 8* – PRIOR ART
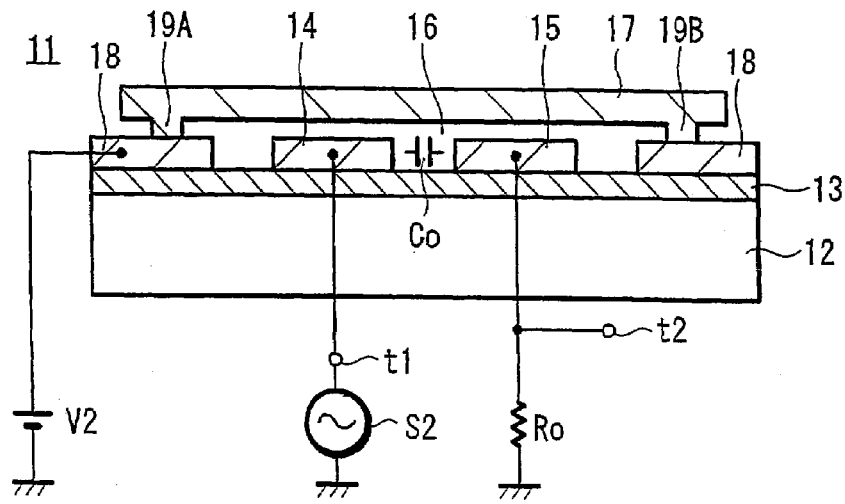
*FIG. 9* – PRIOR ART
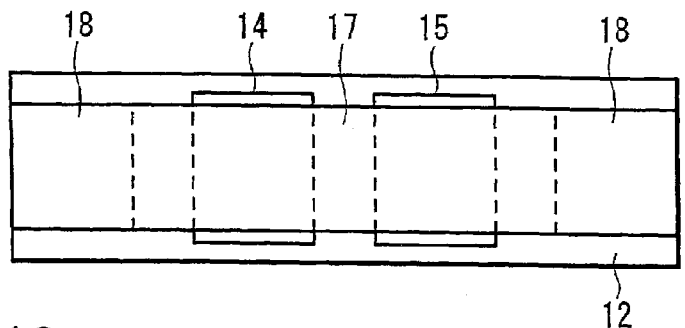
*FIG. 10* – PRIOR ART
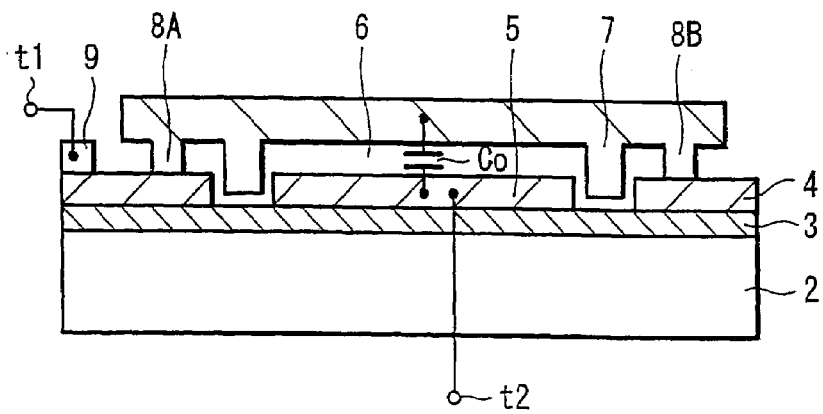

MICRO-RESONATOR AND COMMUNICATION APPARATUS

TECHNICAL FIELD

The present invention relates to a micro-resonator and a communication apparatus including a filter comprising this micro-resonator.

BACKGROUND ART

In recent years, micro-machine (MEMS: Micro Electro Mechanical Systems, ultra-small electrical/mechanical composite device) devices and small devices with MEMS devices assembled therein have received a remarkable attention. Fundamental characteristics of the MEMS device lie in that a driving body constructed as a mechanical structure is assembled into a part of the device and that the driving body can electrically be driven with application of Coulomb's force generated between the electrodes.

Since a micro-vibration device formed by using a micro-machining technology based on a semiconductor process has merits such as a small area occupied by a device, a high Q value and capability of being integrated with other semiconductor devices, its use as an intermediate-frequency (IF) filter and a high-frequency (RF) filter in wireless communication devices has been proposed from research institutions such as Michigan State university (see cited non-patent reference 1).

FIG. 10 shows outline of a vibrator constituting a high-frequency filter, that is, micro-resonator which is described in the cited non-patent reference 1. This resonator 1 includes a semiconductor substrate 2 on which a polycrystalline silicon input side interconnection layer 4 and an output electrode 5 are formed through an insulating layer 3, a polycrystalline silicon vibrating beam, that is, so-called beam type vibrating electrode 7 being formed across a space 7 in an opposing relation to this output electrode 5. The vibrating electrode 7 crosses the output electrode 5 and is connected to the input side interconnection layer 4 in such a manner that it may be supported by anchor portions (supporting portions) 8 [8A, 8B] at both ends thereof. The vibrating electrode 7 acts as an input electrode. A gold (Au) film 9, for example, is formed at the end portion of the input side interconnection layer 4. In this resonator 1, an input terminal t1 is led out from the gold (Au) film 9 of the input side interconnection layer 4 and an output terminal t2 is led out from the output electrode 5.

In this resonator 1, in the state in which a DC bias voltage V1 is applied between the vibrating electrode 7 and the ground, a high-frequency signal S1 is supplied through the input terminal t1 to the vibrating electrode 7. More specifically, when the DC bias voltage V1 and the high-frequency signal S1 are inputted to the resonator 1 from the input terminal t1, the vibrating electrode 7 having a natural oscillation determined by a length L vibrates by electrostatic force generated between the output electrode 5 and the vibrating electrode 7. By the vibration thereof, a time change of a capacitance between the output electrode 5 and the vibrating electrode 7 and a high-frequency signal corresponding to the DC bias voltage are outputted from the output electrode 5 (accordingly, the output terminal t2). The high-frequency filter outputs a signal corresponding to a natural oscillation (resonance frequency) of the vibrating electrode 7.

[Cited non-patent reference 1]: J. R. Clark, W.-T. Hsu, and C. T.-C. Nguyen, "High-QVHF micromechanical contour-mode disk resonators, "Technical Digest, IEEE Int. Electron Devices Meeting, San Francisco, Calif., Dec. 11-13, 2000, pp. 399-402.

Now, resonance frequencies of micro-vibrators that had been proposed and verified do not exceed 200 MHz at the maximum, so that with respect to conventional surface acoustic wave (SAW) filter or film bulk acoustic resonator (FBAR) filter at the GHz region, a high Q value which is the characteristic of the micro-vibrator cannot be provided in the GHz band frequency region.

At the present, a resonance peak of an output signal generally tends to decrease in the high frequency region, and in order to obtain satisfactory filter characteristics, it is necessary to improve an S/N (signal-to-noise ratio) of the resonance peak. According to the disk type resonator concerning the cited non-patent reference 1 of Michigan State University, a noise component of an output signal depends upon a signal which directly passes a parasitic capacitance C0 formed between the vibrating electrode 7 serving as the input electrode and the output electrode 5. On the other hand, the disk type resonator needs a DC bias voltage higher than 30V to obtain a sufficient output signal and hence it is desirable that a beam type structure using center beam should be used as a practical vibrating electrode structure.

DISCLOSURE OF THE INVENTION

As a method for decreasing a noise component, it can be assumed to take an arrangement in which a vibrating electrode to which a DC bias voltage is applied is disposed between an input electrode and an output electrode. FIGS. 8 and 9 show the related art in which the above-described noise component decreasing method is applied to a beam type structure resonator. This resonator 11 includes a semiconductor substrate 12, for example, on which an input electrode 14 and an output electrode 15 are formed through an insulating film 13, an electrode serving as a diaphragm, that is, so-called beam type vibrating electrode 17 being formed across a space 16 in an opposing relation to the input electrode 14 and the output electrode 15. The vibrating electrode 17 is unitarily supported at its respective ends by supporting portions (so-called anchor portions) 19 [19A, 19B] in such a manner that it may cross the input and output electrodes 14, 15 and that it may be connected to an interconnection layer 18 disposed outside the input and output electrodes 14, 15. The input electrode 14, the output electrode 15 and the interconnection layer 18 are made of the same conductive material and they may be formed of metal films such as a polycrystalline silicon film and an aluminum film. The vibrating electrode 17 is, for example, formed of a metal film such as polycrystalline silicon film and an aluminum film.

An input terminal t1 is led out from the input electrode 14 and a high-frequency signal S2 is inputted to the input electrode 14 through the input terminal t1. An output terminal t2 is led out from the output electrode 15 and a high-frequency signal with a desired frequency is outputted from the output terminal t2. A predetermined DC bias voltage V2 is applied to the vibrating electrode 17.

In this micro-resonator 11, when the high-frequency signal S2 is inputted to the input electrode 14, the vibrating electrode 17 oscillates based on electrostatic force generated between the vibrating electrode 17 to which the DC bias voltage V2 is applied and the input electrode 14 so that a high-frequency signal with a desired frequency is outputted from the output electrode 15. According to this micro-resonator 11, since the area in which the input and output electrodes 14 and 15 oppose to each other can be decreased and the spacing between the input and output electrodes 14 and 15 can be increased, the parasitic capacitance C0 between the input and output electrodes 14 and 15 can be decreased. Accordingly, the signal that directly passes the parasitic capacitance C0 between the input and output electrodes 14 and 15, that is, noise component can be decreased, and hence the S/N of the output signal can be increased.

However, a problem encountered with the micro-resonators 1 and 11 having the beam structures shown in FIGS. 10 and 8 is a high impedance. Since impedances of ordinary resonators which are several micrometers to several 10 s of micrometers reach several 10 s of kilo-ohms to several 100 s of kilo-ohms, it was difficult to apply such ordinary resonators to a high-frequency (RF) device in which an impedance of a system is fundamentally 50 Ω.

It is an object of the present invention to provide a micro-resonator capable of lowering a synthesized impedance of a resonator and which can be applied to predetermined devices.

Also, the present invention is an invention to provide a communication apparatus including a filter composed of such a micro-resonator device.

A micro-resonator relating to the present invention is constituted by electrically connecting a plurality of micro-resonator devices having beam structure in parallel to each other.

The aforesaid plurality of micro-resonator devices include a plurality of micro-resonator devices provided with input electrodes and output electrodes which are disposed on the same plane and beams serving as diaphragms disposed across a space with respect to the input electrodes and the output electrodes and it can be constituted such that the plurality of micro-resonator devices are to be disposed on the same substrate in parallel to each other.

The aforesaid plurality of micro-resonator devices can be constituted by multi-beam type micro-resonator devices provided with input electrodes and output electrodes which are disposed on the same plane and beams serving as a plurality of diaphragms disposed in parallel to each other across a space with respect to the input electrodes and the output electrodes.

The aforesaid plurality of micro-resonator devices include a plurality of multi-beam type micro-resonator devices provided with input electrodes and output electrodes which are disposed on the same plane and beams serving as a plurality of diaphragms disposed in parallel to each other across a space with respect to the input electrodes and the output electrodes and it can be constituted such that the plurality of micro-resonator devices are to be disposed on the same substrate in parallel to each other.

In a communication apparatus including a filter for band-limiting a transmission signal and/or a reception signal, the communication apparatus relating to the present invention is constituted such that a filter composed of a micro-resonator in which a plurality of micro-resonator devices having a beam structure formed on the same substrate is electrically connected in parallel to each other is to be used for that filter.

The plurality of micro-resonator devices in the aforesaid filter include a plurality of micro-resonator devices provided with input electrodes and output electrodes which are disposed on the same plane and beams serving as diaphragms disposed across a space with respect to the input electrodes and the output electrodes and it can be constituted such that the plurality of micro-resonator devices are to be disposed on the same substrate in parallel to each other.

The plurality of micro-resonator devices in the aforesaid filter can be constituted by multi-beam type micro-resonator devices provided with beams serving as a plurality of diaphragms disposed in parallel to each other across a space with respect to input electrodes and output electrodes which are disposed on the same plane.

The aforesaid plurality of micro-resonator devices can be constituted by disposing a plurality of multi-beam type micro-resonator devices which are provided with beams serving as a plurality of diaphragms disposed on the same substrate in parallel to each other across a space with respect to input electrodes and output electrodes.

Since the micro-resonator according to the present invention has an arrangement in which a plurality of micro-resonator devices are electrically connected in parallel to each other, a synthesized impedance can be lowered and it can be adjusted to an arbitrary synthesized impedance.

According to the micro-resonator of the present invention, a synthesized impedance of a resonator can be lowered and hence it can be applied to a device having a predetermined impedance. For example, it can be used as a 50 Ω-system high-frequency (RF) device. Also, it becomes possible to manufacture a resonator having an arbitrary synthesized impedance by adjusting the number of resonators which are connected in parallel to each other.

When a plurality of micro-resonator devices are constructed by disposing a plurality of micro-resonator devices on the same substrate in parallel to each other, a synthesized impedance can be adjusted based on the number of a plurality of micro-resonator devices, and in addition, it is possible to manufacture a compact micro-resonator of one device.

When the multi-beam type micro-resonator device is constructed by disposing a plurality of beams in parallel to the common input and output electrodes, it can be regarded as one resonator of which electrode area, that is, beam area is large. A synthesized impedance can be adjusted based on the number of the beams, and it is possible to manufacture a more compact micro-resonator of one device.

When a plurality of micro-resonator devices are constructed by disposing a plurality of multi-beam type micro-resonator devices on the same substrate in parallel to each other, a synthesized impedance can be lowered more and it is possible to manufacture a much more compact micro-resonator of one device.

According to the communication apparatus relating to the present invention, since this communication apparatus includes the filter composed of the above-mentioned micro-resonator, that is, the filter having the synthesized impedance that can be matched with the applied communication apparatus, it is possible to provide a highly-reliable communication apparatus.

BRIEF DESCRIPTION OF DRAWINGS

FIG. 8 is a cross-sectional view showing an example of a micro-resonator according to the related art;

FIG. 9 is a plan view showing an example of a micro-resonator according to the related art; and FIG. 10 is a cross-sectional view showing a conventional micro-resonator.

BEST MODE FOR CARRYING OUT THE INVENTION

Exemplified embodiments of the present invention will be described below with reference to the drawings.

A micro-resonator according to the present invention is a resonator using a micro-scale or nano-scale resonator device.

Figure 1:
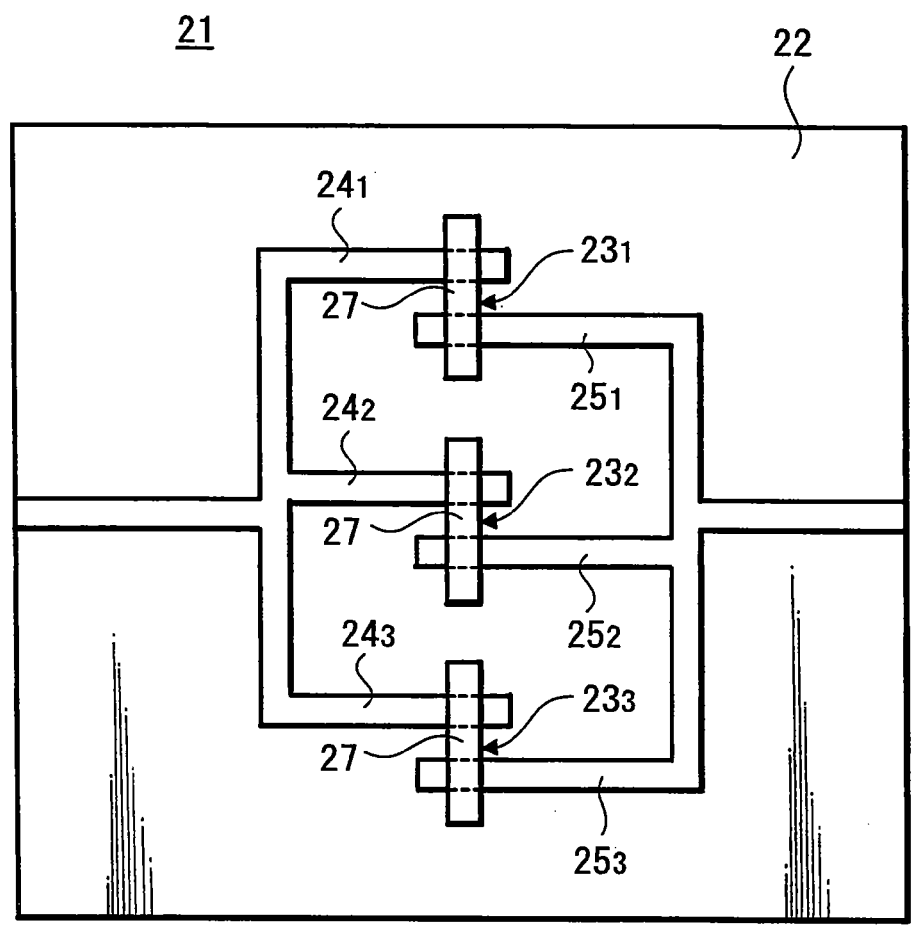
FIG. 1 is a schematic diagram showing one exemplified embodiment of a micro-resonator according to the present invention.
Figure 2A:
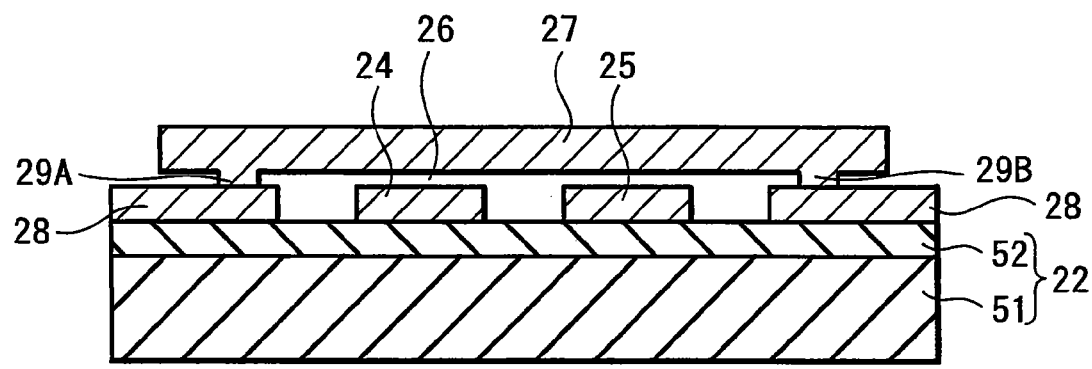
FIG. 2A is a cross-sectional view of a micro-resonator device which is a main portion of FIG. 1
Figure 2B:
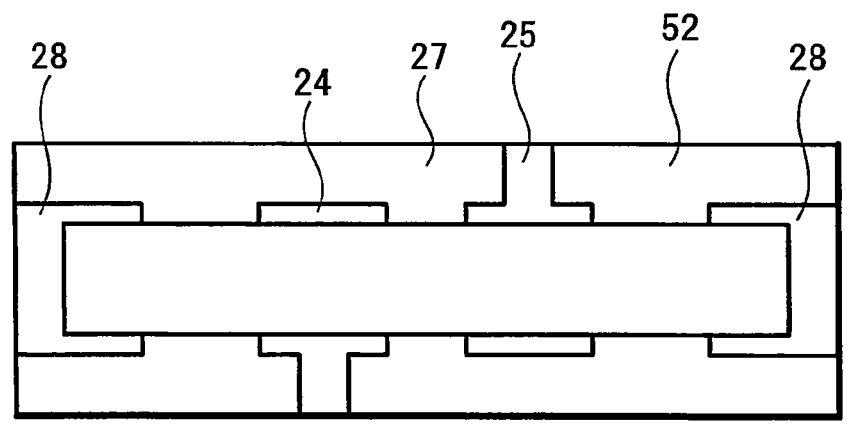
FIG. 2B is a plan view of the micro-resonator device which is a main portion of FIG. 1.

FIG. 1 shows one exemplified embodiment of a micro-resonator according to the present invention. A micro-resonator 21 according to the embodiment of the present invention includes a common substrate 22 on which there are disposed a plurality of micro-resonator devices having beam structures, in this embodiment, three micro-resonator devices 23 [$23_1$, $23_2$, $23_3$] in parallel to each other, these micro-resonator devices 23 [$23_1$, $23_2$, $23_3$] being electrically connected together in parallel to each other. More specifically, as shown in FIG. 1 and FIGS. 2A and 2B, the respective micro-resonator devices $23_1$, $23_2$, $23_3$ are constructed in such a manner that three input electrodes 24 and three output electrodes 25 are respectively branched into three input electrodes $24_1$, $24_2$, $24_3$ and three output electrodes $25_1$, $25_2$, $25_3$ on the same plane of the substrate 22, a beam serving as a diaphragm, that is, so-called beam type vibrating electrode 27 being formed across a space 26 in an opposing relation to the pairs of the thus branched input and output electrodes $24_1$, $25_1$, $24_2$, $25_2$ and $24_3$, $25_3$. The respective micro-resonator devices $23_1$, $23_2$, $23_3$ are disposed on the same substrate 22 in parallel to each other and at the same time, the input electrodes $24_1$, $24_2$, $24_3$ are connected together and the output electrodes $25_1$, $25_2$, $25_3$ are connected together, whereby the micro-resonator devices $23_1$, $23_2$, $23_3$ are connected in parallel to each other. In this embodiment, the input electrodes $24_1$, $24_2$, $24_3$ of a plurality of micro-resonator devices $23_1$, $23_2$, $23_3$ and the output electrodes $25_1$, $25_2$, $25_3$ are connected together, thereby the micro-resonator 21 being constructed as one device.

Each vibrating electrode 27 is unitarily supported at its respective ends by supporting portions (so-called anchor portions) 29 [29A, 29B] so that it may cross the input and output electrodes 24, 25 like a bridge and that it may be connected to interconnection layers 28 disposed outside the input and output electrodes 24, 25. Thus, the vibrating electrode 27 has a center beam structure.

The substrate 22 is a substrate in which an insulating film is formed on a semiconductor substrate such as a silicon (Si) substrate or a gallium arsenic (GaAs) substrate or an insulating substrate such as a quartz substrate or a glass substrate. In this embodiment, there is used a substrate in which a silicon nitride film is formed on a silicon substrate. The input electrodes 24, the output electrodes 25 and the interconnection layers 28 can be made of the same conductive material and, for example, they can be made of the metal film such as a polycrystalline silicon film or an aluminum (Al) film or they can be made of an impurity semiconductor layer in which impurities are introduced into a semiconductor substrate. The vibrating electrode 27 can be formed of a metal film such as a polycrystalline silicon film or an aluminum (Al) film.

A predetermined frequency signal, for example, a high frequency signal is inputted to the common input electrode 24 and a signal with a desired frequency, for example, a high frequency signal is outputted from the common output electrode 25. A predetermined DC bias voltage is applied to each vibrating electrode 27.

The manner in which this micro-resonator 21 is operated will be described below. A predetermined DC voltage is applied to each vibrating electrode 27. When, for example, a high frequency signal is inputted to the input electrode 24, the vibrating electrode 27 resonates in the secondary oscillation mode based on electrostatic force generated between the vibrating electrode 27 and the input electrode 24. Owing to the resonance of this vibrating electrode 27, a high frequency signal with a target frequency is generated from the output electrode 25. When a signal with other frequency is inputted thereto, the vibrating electrode 27 does not resonate so that a signal is not generated from the output electrode 25.

According to the micro-resonator 21 of this exemplified embodiment, a plurality of micro-resonator devices 23 [$23_1$, $23_2$, $23_3$] are disposed in parallel to each other, the respective input electrodes 24 and the respective output electrodes 25 are connected together and the micro-resonator devices $23_1$, $23_2$, $23_3$ are connected in parallel to each other, whereby a synthesized impedance of the micro-resonator 21 can be lowered. That is, a synthesized impedance Za obtained at that time can be obtained as follow.

If $1/Za=(1/Z1)+(1/Z2)+(1/Z3)$ and $Z1=Z2=Z3$ are satisfied, then the following is established:

$$Za=(1/3)\,Z1$$

More specifically, if the respective micro-resonator devices $23_1$, $23_2$ and $23_3$ are formed with the same pattern and the values of the respective impedances Z1, Z2 And Z3 are selected to be the same, the synthesized impedance Za becomes one third of the impedance Z1. Accordingly, if there are provided more than three micro-resonator devices and they are connected in parallel, there can be obtained the micro-resonator 21 having the synthesized impedance that can be matched with the applied electronic device.

Figure 3:
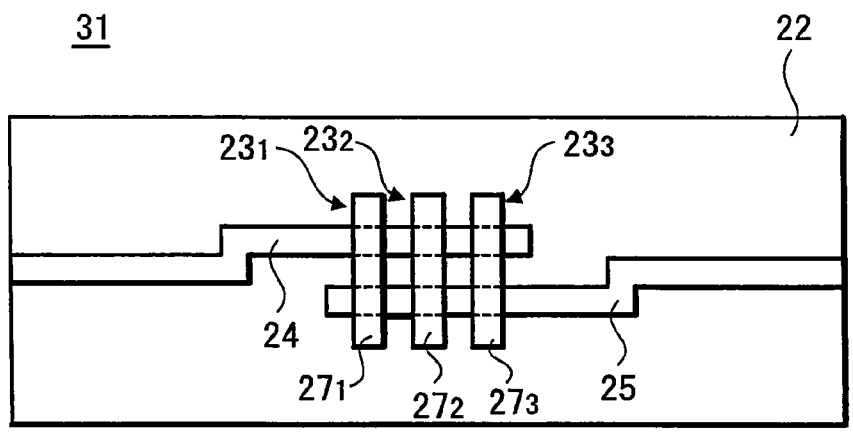
FIG. 3 is a schematic diagram showing another exemplified example a micro-resonator according to the present invention.

FIG. 3 shows another exemplified embodiment of a micro-resonator according to the present invention. A micro-resonator 31 according to this exemplified embodiment is constituted such that an input electrode 24 and an output electrode 25 are formed on a substrate 22, a plurality of independent vibrating electrodes, in this embodiment, three vibrating electrodes 27 [$27_1$, $27_2$, $27_3$] are provided in parallel to each other across a space in an opposing relation to the input electrode 24 and the output electrode 25. More specifically, the three vibrating electrodes 27 [$27_1$, $27_2$, $27_3$] are disposed in parallel to each other along the longitudinal directions of the input and output electrodes 24, 25. The micro-resonator device according to this exemplified embodiment has the arrangement in which a plurality of vibrating electrodes 27 having beam structures are provided with respect to the common input and output electrodes 24, 25 and hence it is referred to as a "multi-beam type micro-resonator device".

In this case, a micro-resonator device $23_1$, is constituted by the vibrating electrode $27_1$, the input electrode 24 and the output electrode 25. A micro-resonator device $23_2$ is constituted by the vibrating electrode $27_2$, the input electrode 24 and the output electrode 25. A micro-resonator device $23_3$ is constituted by the vibrating electrode $27_3$, the input electrode 24 and the output electrode 25. Accordingly, the micro-resonator 31 of this exemplified embodiment becomes a shape which comprises the micro-resonator devices 23 disposed rectilinearly.

A rest of the arrangement is similar to those that have been described with reference to FIG. 1 and FIGS. 2A, 2B and therefore a repetitive explanation thereof will be omitted.

According to the micro-resonator 31 of this exemplified embodiment, the micro-resonator devices $23_1$, $23_2$ and $23_3$ composed of the respective vibrating electrodes $27_1$, $27_2$, $27_3$ become a form in which they are connected in parallel to each other. This micro-resonator 31 can be regarded as if it is one resonator of which vibrating electrode area can be increased by adding the respective vibrating electrodes $27_1$, $27_2$ and $27_3$. As a result, it is possible to decrease a synthesized impedance of the micro-resonator 31. More specifically, a synthesized impedance Zb obtained at that time is given as follows:

$$\text{if } 1/Zb = (1/Z1) + (1/Z2) + (1/Z3) \text{ and } Z1 = Z2 = Z3 \text{ are satisfied, then } Zb = (\frac{1}{3}) Z1 \text{ is established.}$$

As described above, if the respective micro-resonator devices $23_1$, $23_2$ and $23_3$ are formed with the same pattern and the values of the respective impedances Z1, Z2, Z3 are selected to be the same, the synthesized impedance Zb becomes one third of the impedance Z1. Accordingly, if there are disposed more than three vibrating electrodes 27, then there can be obtained the micro-resonator 31 having the synthesized impedance that can be matched with the applied electronic device. This micro-resonator 31 can be made to be more compact as compared with the micro-resonator 21 shown in FIG. 1.

Figure 4:
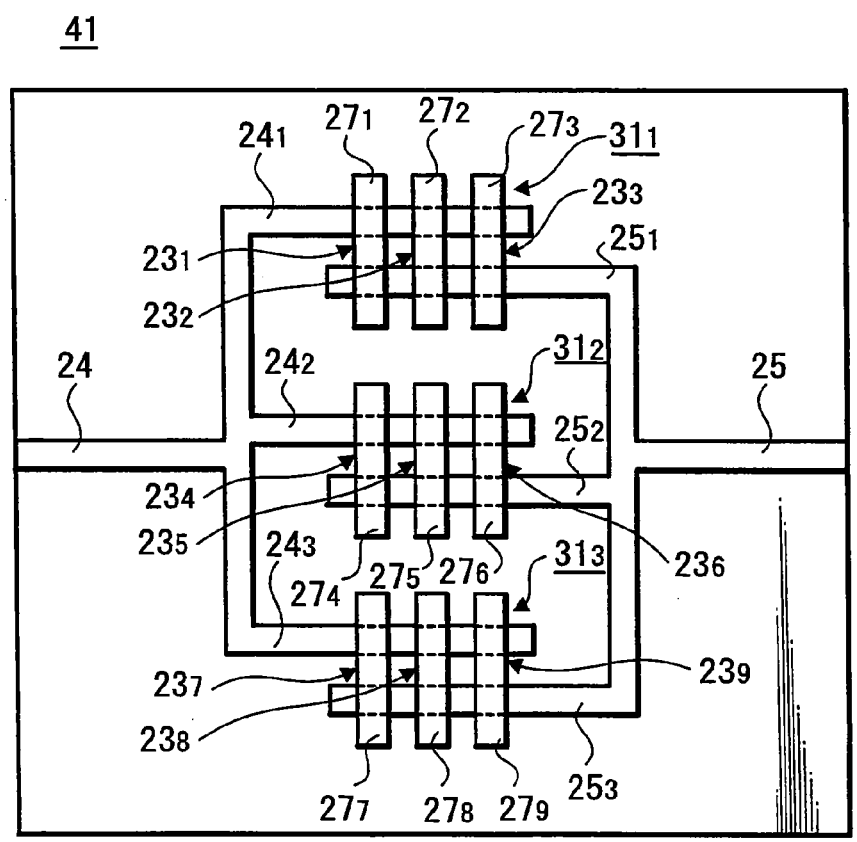
FIG. 4 is a schematic diagram showing still another exemplified example a micro-resonator according to the present invention.

FIG. 4 shows still another exemplified embodiment of a micro-resonator according to the present invention. This exemplified embodiment has an arrangement made by a combination of the micro-resonators 21 and 31 shown in FIGS. 1 and 3.

A micro-resonator 41 according to this exemplified embodiment is constituted such that a plurality, that is three in this embodiment, of multi-beam type micro-resonator devices 31 [$31_1$, $31_2$, $31_3$] are disposed in parallel to each other on the common substrate 22 and these multi-beam type micro-resonator devices 31 [$31_1$, $31_2$, $31_3$] are electrically connected in parallel to each other.

More specifically, the input electrode 24 is branched into three input electrodes and the output electrode 25 is branched into three output electrodes. A multi-beam type micro-resonator device $31_1$, is constituted such that a plurality, that is three in this embodiment, of independent vibrating electrodes 27 [$27_1$, $27_2$, $27_3$] are formed in parallel to each other across the space in an opposing relation to the first pair of branched input and output electrodes $24_1$, $25_1$. A multi-beam type micro-resonator device 312 is constituted such that a plurality, that is three in this embodiment, of independent vibrating electrodes 27 [$27_4$, $27_5$, $27_5$] are formed in parallel to each other across the space in an opposing relation to the second pair of branched input and output electrodes $24_2$, $25_2$. A multi-beam type micro-resonator device $31_3$ is constituted such that a plurality, that is three in this embodiment, of independent vibrating electrodes 27 [$27_7$, $27_8$, $27_9$] are formed in parallel to each other across the space in an opposing relation to the third pair of branched input and output electrodes $24_3$, $25_3$.

In this case, in the multi-beam type micro-resonator device $31_1$, the micro-resonator device $23_1$, is constituted by the vibrating electrode $27_1$, the input electrode $24_1$, and the output electrode $25_1$, the micro-resonator device $23_2$ is constituted by the vibrating electrode $27_2$, the input electrode $24_1$, and the output electrode $25_1$, and the micro-resonator device $23_3$ is constituted by the vibrating electrode $27_3$, the input electrode $24_1$, and the output electrode $25_1$.

In the multi-beam micro-resonator device $31_2$, the micro-resonator device $23_4$ is constituted by the vibrating electrode $27_4$, the input electrode $24_2$ and the output electrode $25_2$, the micro-resonator device $23_5$ is constituted by the vibrating electrode $27_5$, the input electrode $24_2$ and the output electrode $25_2$, and the micro-resonator device $23_6$ is constituted by the vibrating electrode $27_6$, the input electrode $24_2$ and the output electrode $25_2$.

Further, in the multi-beam type micro-resonator device $31_3$, the micro-resonator device $23_7$ is constituted by the vibrating electrode $27_7$, the input electrode $24_3$ and the output electrode $25_3$, the micro-resonator device $23_8$ is constituted by the vibrating electrode $27_8$, the input electrode $24_3$ and the output electrode $25_3$, and the micro-resonator device $23_9$ is constituted by the vibrating electrode $27_9$, the input electrode $24_3$ and the output electrode $25_3$.

The rest of the arrangement is similar to those explained in FIGS. 1 and 3 and therefore, the repetitive explanation thereof will be omitted.

According to the micro-resonator 41 of this exemplified embodiment, since it is constituted such that a plurality of multi-beam type micro-resonator devices $31_1$, $31_2$ and $31_3$ having a shape in which a plurality of micro-resonator devices 23 are disposed rectilinearly are disposed in parallel to each other, the number of the parallel-connected micro-resonator devices increases so that the impedance of the micro-resonator 41 can be decreased. That is, a synthesized impedance Zc obtained at that time can be obtained as follows:

$$1/Zc = (1/Z1) + (1/Z2) + (1/Z3) + (1/Z4) + (1/Z5) + (1/Z6) + (1/Z7) + (1/Z8) + (1/Z9)$$

Here, if $Z1 = Z2 = Z3 = Z4 = Z5 = Z6 = Z7 = Z8 = Z9$ are satisfied, the synthesized impedance Zc can be given as $Zc = (\frac{1}{9}) Z1$ In this manner, if the respective multi-beam type micro-resonator devices $31_1$, $31_2$, $31_3$ are formed with the same pattern and the values of the respective impedance values Z1 to Z9 are selected to be the same, the synthesized impedance Zc becomes one ninth of the impedance Z1. Accordingly, if more than three vibrating electrodes 27 of the respective multi-beam type micro-resonator devices 31 are disposed and more than three multi-beam type micro-resonator devices 31 are disposed, there can be obtained the micro-resonator 41 having the synthesized impedance that can be matched with the applied electronic device. This micro-resonator 41 can be made to be more compact as compared with the micro-resonators 21 and 31 shown in FIGS. 1 and 3.

Next, a manufacturing method of a micro-resonator of the exemplified will be explained with reference to FIGS. 5A to 5E and FIGS. 6A to 6D. It should be noted in the drawings that there are shown the cross-sectional structures of the micro-resonator device which is the main portion thereof.

Figure 5A:
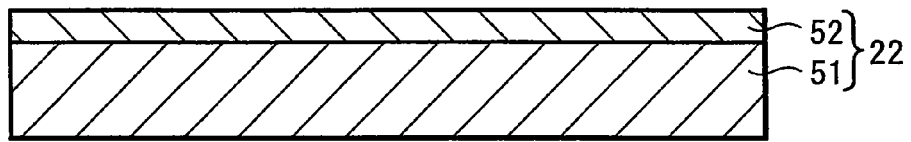
FIGS. 5A to 5E are manufacturing process diagrams (No. 1) showing one exemplified embodiment of a method of manufacturing a micro-resonator according to the present invention, respectively.

According to this exemplified embodiment, first, as shown in FIG. 5A, there is prepared a substrate 22 on which an insulating film 51 having a predetermined film thickness is formed on the upper surface of a silicon substrate 51. In this embodiment, the substrate 22 is formed by forming the silicon nitride film (SiN) film 52 having a film thickness of 1 μm on the silicon substrate 51.

Figure 5B:
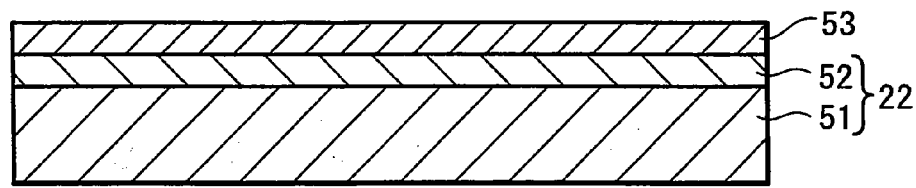

Next, as shown in FIG. 5B, a conductive film 53 having a predetermined film thickness, which serves as a lower electrode, that is, an input and output electrode, is formed on the insulating film 52 of the substrate 22. In this embodiment, a polycrystalline silicon film 53 having a film thickness of 0.5 μm is formed on the silicon nitride film 52 by vapor-deposition.

Figure 5C:
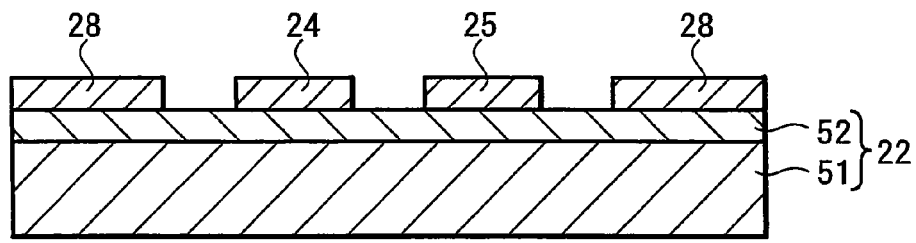

Subsequently, as shown in FIG. 5C, the input electrode 24 and the output electrode 25 serving as the lower electrode and the interconnection layer 28 are formed by patterning the polycrystalline silicon film 53 according to the selective etching process. The patterns of the input and output electrodes 24, 25 and the interconnection layer 28 are made corresponding to those of FIGS. 1, 3 and 4 which were described above.

Figure 5D:
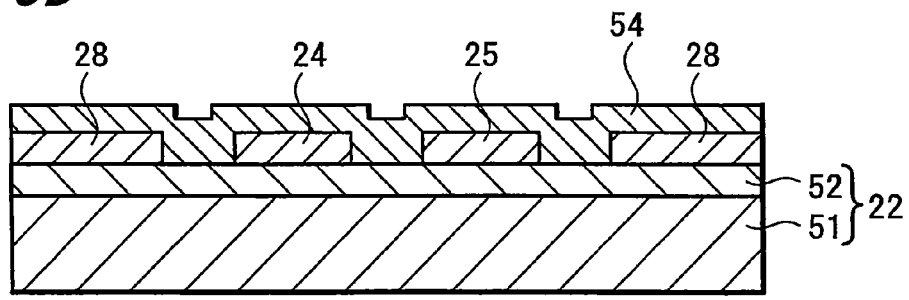

Next, as shown in FIG. 5D, a sacrifice layer 54 having a predetermined film thickness is formed on the whole surface of the substrate 22 including the upper surfaces of the input and output electrodes 24, 25 and the interconnection layer 28. In this embodiment, the silicon oxide ($SiO_2$) film 54 having a film thickness of 0.5 μm that serves as the sacrifice layer is formed by the vapor-deposition process.

Figure 5E:
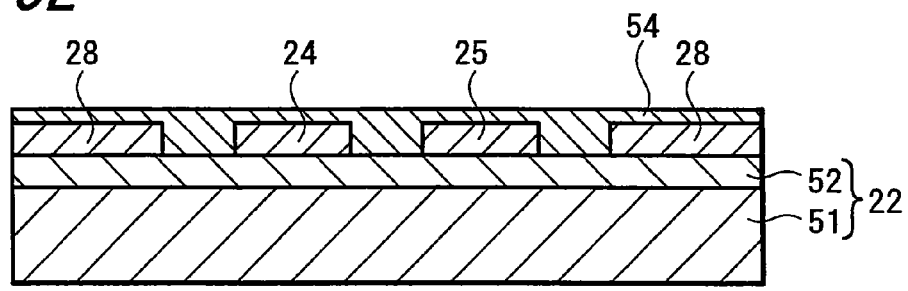

Next, as shown in FIG. 5E, the sacrifice layer 54 is planarization processed and thereby the film thickness of the sacrifice layer 54 on the input and output electrodes 24, 25 is set to the predetermined film thickness. The film thickness of this sacrifice layer 54 corresponds to a height of a space 26 between the aforementioned vibrating electrode 27 and the input and output electrodes 24, 25. In this embodiment, the silicon oxide film 54 of the sacrifice layer is planarized by a CMP (chemical mechanical polish) method and thereby the silicon oxide film 54 having a film thickness of 0.1 μm is left on the input and output electrodes 24, 25.

Figure 6A:
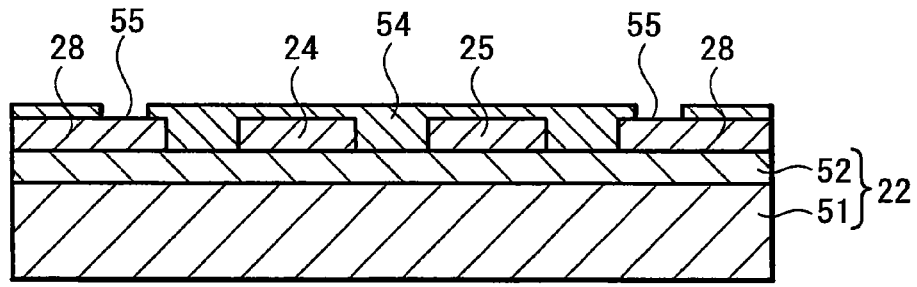
FIGS. 6A to 6D are manufacturing process diagrams (No. 2) showing one exemplified embodiment of a method of manufacturing a micro-resonator according to the present invention, respectively.

Next, as shown in FIG. 6A, a part of the sacrifice layer 54 is etched selectively and thereby a contact hole 55 for exposing a part of the interconnection layer 28 is formed.

Figure 6B:
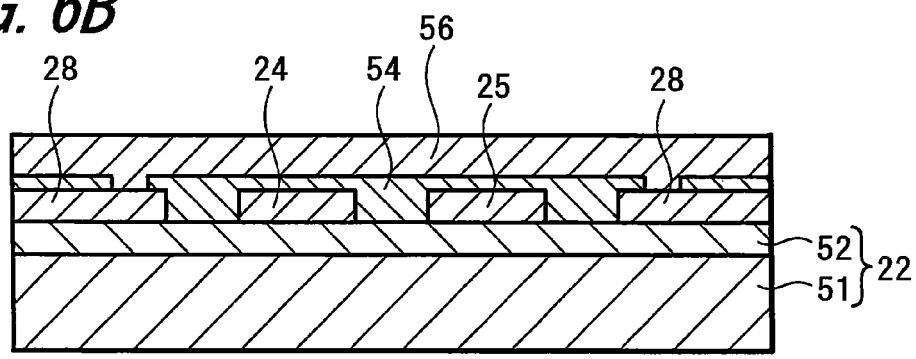

Next, as shown in FIG. 6B, a vibrating electrode, that is, a conductive film 56 having a predetermined film thickness serving as the beam is formed on the sacrifice layer 54. At that time, a part of the conductive film 56 is connected to the interconnection layer 28 through the contact hole 55. In this embodiment, the polycrystalline silicon film 56 having a film thickness of 0.5 μm that serves as the beam is formed by vapor-deposition.

While the aforementioned polycrystalline silicon films 53, 56 and the silicon oxide film 54 can be formed by a CVD (chemical vapor deposition) method which is a chemical vapor-deposition method, it is also possible to form them by a physical vapor-deposition method.

Figure 6C:
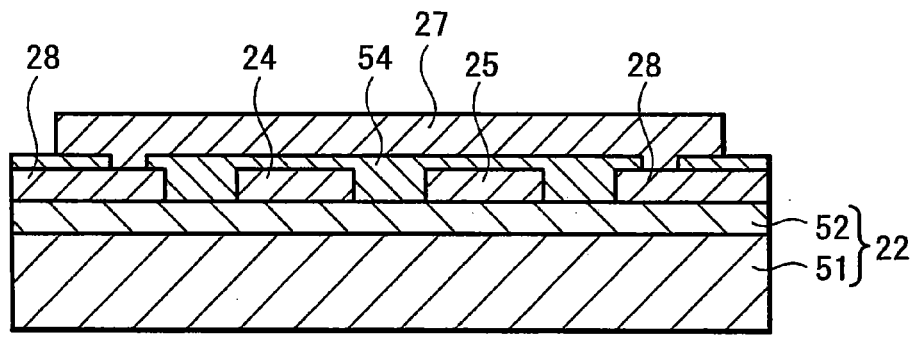

Next, as shown in FIG. 6C, a beam 27 which serves as a vibrating electrode is formed by patterning the polycrystalline silicon film 56 which is the conductive film. The pattern of this beam 27 is made to be a pattern corresponding to those of the patterns in FIGS. 1, 3 and 4 which were described above.

Figure 6D:
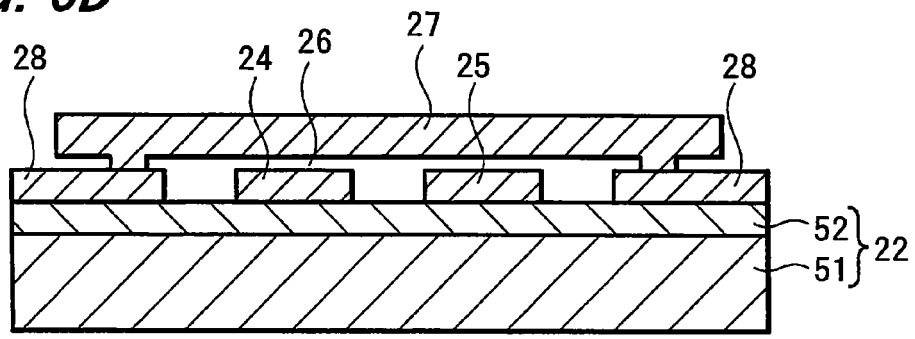

Next, as shown in FIG. 6D, the sacrifice layer 54 is removed selectively. In this embodiment, the silicon oxide layer 54, which is the sacrifice layer, is removed by using hydrogen fluoride. As a result, there can be obtained the micro-resonators 21, 31 or 41 shown in FIGS. 1, 3 or 4 in which the beams, accordingly, the vibrating electrodes 27 are disposed across the predetermined space 26 in an opposing relation with respect to the input electrode 24 and the output electrode 25.

According to the above-mentioned micro-resonators 21, 31 or 41 relating to these exemplified embodiments, the synthesized impedance of the resonators is lowered in any one of them and it can be applied to devices having predetermined impedances. For example, it can be used as a high-frequency (RF) device of 50 Q system. Also, it becomes possible to manufacture a resonator having an arbitrary synthesized impedance by adjusting the number of the resonators connected in parallel to each other.

According to the micro-resonator 21, it is possible to adjust a synthesized impedance by the number of a plurality of micro-resonator devices and at the same time, it is possible to manufacture a micro-resonator in which the size thereof is made to be compact.

According to the micro-resonator 31, it can be regarded as one resonator having a large electrode area, that is, a vibrating electrode area. It is possible to adjust a synthesized impedance by the number of the vibrating electrodes and it is possible to manufacture the micro-resonator in which the size thereof is made to be more compact.

According to the micro-resonator 41, it is possible to lower the synthesized impedance more based on the number of the multi-beam type micro-resonator devices and the number of the vibrating electrodes within the multi-beam type micro-resonator device and it is possible to manufacture the micro-resonator in which the size thereof is made to be more compact.

A filter composed of the micro-resonators according to the above-mentioned respective exemplified embodiments can be used as suitable filters such as a high-frequency (RF) filter, an intermediate-frequency (IF) filter and the like.

It is possible for the present invention to provide a communication apparatus which carries out communications via electromagnetic waves such as a mobile phone, a wireless LAN apparatus, a wireless transceiver, a television tuner, a radio tuner and the like.

Next, an arrangement example of a communication apparatus to which the filter according to the above-mentioned exemplified embodiments of the present invention is applied will be explained with reference to FIG. 7.

First, an arrangement of the transmission system of this communication apparatus will be described, wherein I-channel transmission data and Q-channel transmission data are supplied to digital-to-analog converters (DAC) 201I and 201Q and thereby converted to analog signals thereof. The converted signals of the respective channels are supplied to band-pass filters 202I and 202Q in which their signal components with bands other than the transmission signal bands are eliminated and outputs of the band-pass filters 202I and 202Q are supplied to a modulator 210.

In the modulator 210, signals are supplied to mixers 212I and 212Q through buffer amplifiers 211I and 211Q for each channel, in which they are mixed with a frequency signal with a frequency corresponding to a transmission frequency supplied from a transmission phase-locked loop (PLL) circuit 203 and modulated, and both of the mixed signals are added by an adder 214 so as to become a transmission signal of one system. In this case, the frequency signal that is to be supplied to the mixer 212I is phase-shifted by 90° in a phase shifter 213, whereby the I-channel signal and the Q-channel signal are modulated orthogonally.

The output from the adder 214 is supplied to a power amplifier 204 through a buffer amplifier 215, in which it is amplified so as to become a predetermined electric power. The signal amplified by the power amplifier 204 is supplied to an antenna 207 through a transmission and reception switcher 205 and a high-frequency filter 206 and it is radio-transmitted from the antenna 207. The high-frequency filter 206 is a band-pass filter for eliminating signal components other than the frequency bands that may be transmitted and received by this communication apparatus.

As for an arrangement of a reception system, a signal received at the antenna 207 is supplied to a high-frequency unit 220 through the high-frequency filter 205 and the transmission and reception switcher 205. In the high-frequency unit 220, the received signal is amplified by a low-noise amplifier (LNA) 221 and thereafter is supplied to a band-pass filter (BPF) 222, in which a signal component other than the reception frequency band is eliminated and the thus eliminated signal is supplied to a mixer 224 through a buffer amplifier 223. Then, it is mixed with a frequency signal supplied from a channel selection PLL circuit 251, thereby a signal of a predetermined transmission channel is converted to an intermediate-frequency signal and the intermediate-frequency signal is supplied to an intermediate-frequency circuit 230 through a buffer amplifier 225.

In the intermediate-frequency circuit 230, the intermediate-frequency signal supplied thereto is supplied to a band-pass filter 232 through a buffer amplifier 231, in which a signal component other than an intermediate-frequency signal band is eliminated, and the thus eliminated signal is supplied to an automatic gain control circuit (AGC circuit) 233, in which it becomes a signal with a substantially constant gain. The intermediate-frequency signal gain controlled by the automatic gain control circuit 233 is supplied to a demodulator 240 through a buffer amplifier 234.

In the demodulator 240, the intermediate-frequency signal supplied thereto is supplied to mixers 242I and 242Q through a buffer amplifier 241, in which it is mixed with a frequency signal supplied from an intermediate-frequency PLL circuit 252 and thereby received I-channel signal component and Q-channel signal component are demodulated. In this case, it is constituted such that the I-channel signal mixer 242I is supplied with a frequency signal phase-shifted by 90° in a phase shifter 243 and thereby the thus orthogonally-modulated I-channel signal component and Q-channel signal component are demodulated.

The thus demodulated I-channel signal and Q-channel signal are respectively supplied to band-pass filters 253I and 253Q through buffer amplifier 244I and 244Q, in which signal components other than the I-channel and Q-channel signals are eliminated and the eliminated signals are supplied to analog-to-digital converters (ADCs) 254I and 254Q, in which they are sampled and converted to digital data and thus, I-channel received data and Q-channel received data are obtained.

In the arrangement that has been described so far, the filters having the arrangements according to the above-mentioned exemplified embodiments can be applied to part of or whole of the band-pass filters 202I, 202Q, 206, 222, 232, 253I and 253Q so as to carry out band-limitation.

According to the communication apparatus of the present invention, since the aforementioned filters, that is, the filters having the synthesized impedance that can be matched with the communication apparatus to be applied are included, it is possible to provide a highly-reliable communication apparatus.

Figure 7:
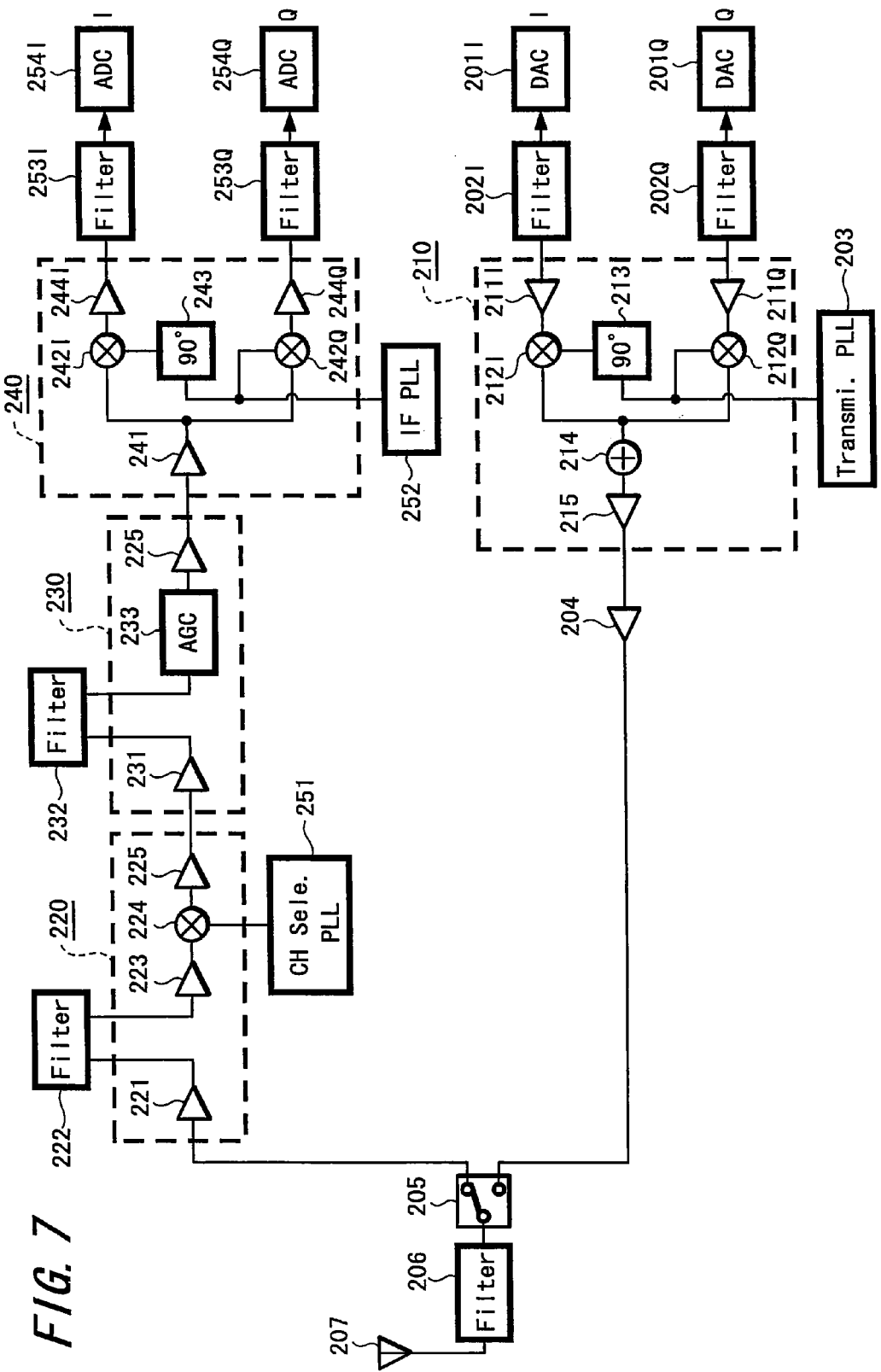
FIG. 7 is a circuit diagram showing one exemplified embodiment of a communication apparatus according to the present invention.

While, in the embodiment shown in FIG. 7, the respective filters are constituted as band-pass filters, they may be constituted as low-pass filters which can pass a frequency band lower than a predetermined frequency or as high-pass filters which can pass a frequency band higher than a predetermined frequency, in which the arrangements according to the above-mentioned exemplified embodiments can be applied to those filters. Further, while, in the embodiment shown in FIG. 7, a communication apparatus for carrying out radio transmission and reception was employed, the present invention may be applied to a filter provided in a communication apparatus which caries out transmission and reception through a wire transmission line and furthermore, the arrangements according to the above-mentioned exemplified embodiments can be applied to a filter provided in a communication apparatus which caries out only a transmission process or only a reception process.

The invention claimed is:

1. A micro-resonator comprising:
a substrate;
a plurality of micro-resonator devices having a beam structure on said substrate,
wherein,
said beam structure includes at least two physically unconnected vibrating electrode beams that are parallel to each other and cross over a portion of the substrate, and
said micro-resonator devices are electrically connected in parallel.

2. A micro-resonator according to claim 1, wherein each of said plurality of micro-resonator devices is composed of:
an input electrode on the same plane as the substrate,
an output electrode on the same plane as the substrate and parallel to the input electrode,
a space between the input electrode and the output electrode,
a vibrating electrode beam serving as a diaphragm crossing over the space between the input electrode and the output electrode and in an opposing relation to the input electrode and the output electrode.

3. A micro-resonator comprising:
a substrate;
a plurality of micro-resonator devices having a beam structure on said substrate,
wherein,
said beam structure includes a vibrating electrode beam,
said micro-resonator devices are electrically connected in parallel,
each of said plurality of micro-resonator devices has an input electrode on the same plane as the substrate that branches into at least two branched input electrodes,
each of said plurality of micro-resonator devices has an output electrode on the same plane as the substrate that branches into at least two branched output electrodes and the branched output electrodes are parallel to the branched input electrodes,
each of said plurality of micro-resonator devices has a space between the branched input electrodes and the branched output electrodes, and
each of said plurality of micro-resonator devices has a vibrating electrode beam serving as a diaphragm crossing over the space between a branched input electrode and a branched output electrode and in an opposing relation to the input electrode and the output electrode.

4. A communication apparatus comprising:
a filter for band-limiting a transmission signal and/or a reception signal,
wherein the filter comprises:
a micro-resonator with a plurality of micro-resonator devices having a beam structure on a substrate,
the micro-resonator devices are electrically connected in parallel, and
the beam structure includes at least two physically unconnected vibrating electrode beams that are parallel to each other and cross over a portion of the substrate.

5. A communication apparatus according to claim 4, wherein each of said plurality of micro-resonator devices in said filter includes:
an input electrode on the same plane as the substrate, an output electrode on the same plane as the substrate and parallel to the input electrode, a space between the input electrode and the output electrode, and an vibrating electrode beam serving as a diaphragm crossing over the space between the input electrode and the output electrode and in an opposing relation to the input electrode and the output electrode.

6. A communication apparatus comprising:

a filter for band-limiting a transmission signal and/or a reception signal, wherein the filter comprises:

a micro-resonator with a plurality of micro-resonator devices having a beam structure on a substrate, the micro-resonator devices are electrically connected in parallel, and the beam structure includes a vibrating electrode beam, each of said plurality of micro-resonator devices in said filter includes an input electrode on the same plane as the substrate that branches into at least two branched input electrodes, each of said plurality of micro-resonator devices in said filter includes an output electrode on the same plane as the substrate that branches into at least two branched output electrodes and the branched output electrodes are parallel to the branched input electrodes, each of said plurality of micro-resonator devices in said filter includes a space between the branched input electrodes and the branched output electrodes, each of said plurality of micro-resonator devices in said filter includes a vibrating electrode beam serving as a diaphragm crossing over the space between a branched input electrode and a branched output electrode and in an opposing relation to the input electrode and the output electrode.

7. A communication apparatus according to claim 4, wherein each of said plurality of micro-resonator devices in said filter includes:

an input electrode on the same plane as the substrate, an output electrode on the same plane as the substrate and parallel to the input electrode, a space between the input electrode and the output electrode, more than one vibrating electrode beam crossing over the space between the input electrode and the output electrode in an opposing relation to the input electrode and the output electrode, each beam serving as a diaphragm and parallel to each other.

* * * * *